United States Patent [19]

Gautreaux et al.

[11] Patent Number: 4,981,102
[45] Date of Patent: Jan. 1, 1991

[54] CHEMICAL VAPOR DEPOSITION REACTOR AND PROCESS

[75] Inventors: Marcelian F. Gautreaux; Walter W. Lawrence, Jr.; George A. Daniels; Gordon A. Hughmark, all of Baton Rouge, La.

[73] Assignee: Ethyl Corporation, Richmond, Va.

[21] Appl. No.: 833,256

[22] Filed: Feb. 27, 1986

Related U.S. Application Data

[62] Division of Ser. No. 599,350, Apr. 12, 1984.

[51] Int. Cl.$^5$ .............................................. C23C 16/24
[52] U.S. Cl. ...................................... 118/725; 264/81
[58] Field of Search ........................... 264/81; 118/725

[56] References Cited

U.S. PATENT DOCUMENTS

| | | | |
|---|---|---|---|
| 3,623,712 | 11/1971 | McNeilly | 263/41 |
| 3,673,983 | 7/1972 | Strater | 118/725 |
| 3,805,736 | 4/1974 | Foehring | 118/719 |
| 3,850,679 | 11/1974 | Sopko | 427/248.1 |
| 3,865,647 | 2/1975 | Reuschel | 148/175 |
| 3,899,557 | 8/1975 | Dietze | 264/81 |
| 3,961,003 | 6/1976 | Parsels | 264/81 |
| 4,131,659 | 12/1978 | Authier | 264/81 |
| 4,238,436 | 12/1980 | Hill | 264/81 |
| 4,292,264 | 9/1981 | Cota | 264/81 |

OTHER PUBLICATIONS

Perry, Chemical Engineer's Handbook, McGraw Hill, N.Y. ©1963, pp. 5-22 and 5-23.

Primary Examiner—Richard Bueker
Attorney, Agent, or Firm—Philip M. Pippinger

[57] ABSTRACT

A reactor having a heated liner for producing silicon by chemical vapor deposition (CVD) and means for supplying a gas stream in the turbulent flow region. A gas stream including a silicon-containing compound is passed through a deposition chamber at turbulent flow rates for deposition of silicon on a non-reactive substrate liner heated above the decomposition temperature of the silicon-containing compound. Optionally, the liner is removable from the reactor for separation of deposited metal. Also optionally, the temperature of the liner in situ may be raised above the melting point of the deposited metal for melt out and recovery.

11 Claims, 3 Drawing Sheets

FIG. 4

CHEMICAL VAPOR DEPOSITION REACTOR AND PROCESS

This application is a division of application Ser. No. 599,350 filed Apr. 12, 1984.

BACKGROUND OF THE INVENTION

1. Field of the Invention

This invention relates in general to the production of high purity materials suitable for use in diode-type applications such as solar cells and other semiconductor devices. The invention relates more particularly to the chemical vapor deposition (CVD) of silicon onto a heated substrate as well as apparatus therefor.

2. Description of the Prior Art

Methods for the production of high purity semiconductor materials are known. Most significant among those methods is the pyrolytic decomposition of chlorosilanes and silane to deposit silicon on resistively heated carrier rods in an inert, usually $H_2$ atmosphere. Hydrogen and, where chlorosilanes are used, HCl are by-products. This method has been carried out in the so-called "Siemens" reactor, a quartz bell jar having one or more carrier rods of silicon, heated to red by the passage of electric current therethrough. The silane or chlorosilane decomposes at the reactor temperature and deposits silicon, usually polycrystalline silicon, onto the carrier rod or rods. The gas stream is heated to facilitate deposition. Sometimes silicon is deposited on the quartz walls. In a later improvement, cooling is provided at the walls to limit deposition thereon.

Many horizontal and vertical CVD apparatus use laminar flow with low conversion and a relatively short contact time of the deposition gas. Highly turbulent areas such as eddys are avoided because they increase non-uniform deposition and gas phase nucleation, the latter causing many problems including dusting on surfaces and reactant loss. Thus no study reports on deposition with a Reynold's Number for the gas stream above about 1600. The present commercial practice is restricted to laminar flow and low conversion during a long contact time. A gas is delivered at either a slow flow rate, or in the current commercial Siemens process, at effectively a zero flow rate for a sufficiently long residence time to effect decomposition and deposition.

The semiconductor grade silicon from chlorosilane decomposition is of very high purity, i.e., with the substantial absence of electrically active contaminants such as boron and phosphorus. Since boron and phosphorus, among other metal contaminants, are normally found in silicon source materials such as quartz, their elimination at every opportunity is important. Purification of quartz (predominantly $SiO_2$) to metallurgical grade silicon results in about 95–99% purity. The metallurgical grade silicon is used as a source material to make halosilanes or silane of high purity. Chemical vapor deposition and subsequent processing often results in silicon purity of 99.9999%. The subsequent processing is usually either Czochralski seed-pulling from a melt of silicon or float-zone processing techniques, both well known and widely used in the art. Other new techniques including ribbon production and edge-defined growth technique (EFG) are also used to prepare single crystal silicon for solar cell or other semiconductor device applications. Single crystal ingots are sawed into wafer shapes and polished.

One of the problems of some prior art systems is "dusting" caused by nucleation of silicon in the gas stream (creating silicon dust) rather than at the deposition surface.

Since the semiconductor industry is growing at such a rapid rate and with fierce competition, there exists a need to lower the cost of production. One area where cost reduction is sought is the chemical vapor deposition of polycrystalline silicon and other semiconductor materials.

Despite the fact that productions of silicon by known processes is very expensive, a great demand exists for polycrystalline silicon product.

SUMMARY OF THE INVENTION

The present invention is directed to the problem of providing large quantities of high purity materials suitable for solar cell and semiconductor applications in an economical fashion by safe means.

The invention overcomes problems of the prior art by providing methods and apparatus which produce large ingots or bulk of polycrystalline silicon.

The present invention is a reactor for growing high purity silicon from a deposition gas containing silicon, said reactor comprising:
 (a) an insulated housing;
 (b) a liner having a deposition surface defining a gas flow path, said liner being adapted to fit inside said housing;
 (c) means for supplying a turbulent flow of deposition gas to the flow path to deposit silicon on said deposition surface;
 (d) means for exhausting gas from the flow path; and
 (e) means for controlling the temperature of said deposition surface and silicon deposited thereon so as to decompose turbulent flow deposition gas in contact therewith and deposit silicon from the gas.

The present invention is also a process for depositing silicon onto a heated deposition surface in a reactor from a gas stream comprising a gaseous silicon compound, said process comprising the steps of:
 (a) heating a deposition surface in a reactor to a temperature above the decomposition temperature of the gaseous silicon compound;
 (b) supplying the gas stream at a temperature below the decomposition temperature of the gaseous silicon compound and at a rate so as to provide a turbulent flow of the gas stream to the deposition surface;
 (c) thereby depositing silicon on said deposition surface with minimal nucleation of silicon from the gaseous silicon compound in the gas stream; and
 (d) recovering the silicon deposited on said deposition surface.

The present invention is intended to provide new improved chemical vapor deposition processes and apparatus capable of economically production very pure semiconductor materials while avoiding energy-wasteful techniques of the prior art including excessive and repetitious heating of carrier gas.

The present invention takes advantage of flow rate characteristics so as to improve deposition rates while maintaining product purity. The invention employs turbulent flow rates of gases containing a silicon compound and also has the beneficial effect of preventing nucleation of silicon not at the deposition surface. This nucleation is the decomposition of the gaseous silicon compound while it is in the gas stream and not at or near the deposition surface. This decomposition results in silicon particles in the form of dust or larger agglomerations which are carried away in the gas stream or dropped elsewhere but are not deposited on the heated deposition surface. It is recognized that in the past the art has recognized that an increased flow rate can increase the deposition rate. However, the art has required that the flow rate must remain in the laminar region to avoid turbulence which results in gas phase nucleation (dusting) and non-uniform deposition.

By the present invention we have now found the advantageous deposition of silicon at a high rate by delivery a very high mass rate of silicon-containing gas to a large heated surface area for silicon deposition. The apparatus and process of the invention are operated in the turbulent flow region so that the deposition of silicon is primarily controlled by the mass transfer mechanism. This is in marked contrast to the processes of the prior art which are operated in the laminar flow region where surface reactions control the deposition rate of silicon.

This invention surprisingly shows that the stagnant boundary layer at the silicon deposition surface can be practically eliminated without a significant amount of gas phase nucleation and with essentially uniform deposition. This results in very high deposition rates never before achieved or even envisioned.

The invention also provides large surface area semiconductor grade materials to facilitate processing end products both by existing and new techniques. Preferably, there is more than one surface area for heating in the reactor and at least two of the surfaces areas are facing each other for conservation of radiant energy. In fact, the flow path may take a very tortuous route since there is no concern to preserve laminar flow in the deposition area. Rather, any formation of the flow path and heated deposition surfaces which increases the turbulence of the flow is in accordance with the invention. The invention includes annular flow paths, rectangular configurations, flow paths taking numerous directions, and various configurations including for example, a corrugated flow path.

The apparatus and process of the present invention are highly advantageous in that the overall economics for deposition of silicon onto a heated surface are greatly improved due to the high mass flow rate of gaseous silicon compound which is decomposed for deposition on the heated surface with minimum nucleation.

It is profferred that the turbulent flow conditions of the present invention result in the rapid return of decomposing gas molecules to the deposition surface. Since the silicon atoms resulting from decomposition are rapidly returned to the deposition surface by action of the turbulent flow, the opportunity for gas phase nucleation of silicon particles is markedly decreased. The invention's advantages will be apparent from a review of the drawing figures and the following description of an embodiment of the best mode of the invention now known to us.

BRIEF DESCRIPTION OF THE DRAWINGS

A better understanding of the invention may be had by a reading of the detailed description below when read in conjunction with the following drawings wherein like reference numerals represent like characters throughout.

DESCRIPTION OF THE PREFERRED EMBODIMENTS

The invention provides an economical process and reactor for high volume production of high purity semiconductor silicon. The invention is intended for use in the production of silicon for use in solar cell and semiconductor device applications.

The invention uses a novel reactor and process and may be constructed/operated to minimize radiant heat loss.

The present invention permits rapid deposition of large areas of silicon in a manner which tends to minize nucleation by using turbulent flow rates ($N_{Re} > 2000$).

The silicon product of the invention is suitable for use in photovoltaic, semiconductor, or other known silicon applications.

The gas stream of the apparatus and process of the present invention is often comprised of a carrier gas as well as the decomposable gaseous silicon compound. Nevertheless, the gaseous silicon compound may comprise 100% of the gas stream in some instances since this may lead to the highest deposition rate and greatest efficiency of the apparatus and process. Thus, for example, the gas stream could be entirely silane. In another situation, the gas stream could comprise as little as 5-10% of the gaseous silicon compound along with a carrier gas which does not react.

Carrier gases are usable with the invention and include hydrogen, helium, HCl, noble gases, and other gases which may or may not be inert with respect to the chemical vapor deposition being used.

The liner of the invention may be of unitary construction or have separate and numerous deposition surfaces. The liner may be of one material only or coated to provide a noncontaminating surface. For example, where a tubular rectangular cross section of molybdenum is used, the inside (deposition) surface may or may not be coated with silicon nitride, graphite, silicon, or other high temperature material.

Since the liner is heated above the decomposition temperature of the silicon-containing compound in the CVD carrier gas stream, the material of construction must have a melting point safely above the decomposition temperature. For example, where trichlorosilane is used, a deposition surface in excess of 900° C. is desirable. Thus, silicon is itself a good deposition surface material in this example since its melting point is 1410° C. Although graphite may present some contamination problems, it may be desirable to construct the liner deposition surface from molybdeum (m.p. 2610° C.) for silicon deposition, especially in the case where the silicon is separated from the liner by melting at the interfact and removal. In some CVD embodiments, quartz, silicates and other compounds are suitable for the deposition surface. Materials such as $Si_3N_4$, sialon, and silicon carbide are suitable for the liner of the invention. Numerous materials which may be suitable for the liner of the invention are disclosed in *Compatibility Studies of*

*Various Refractory Materials in Contact with Molted Silicon*, LSSA Project Task Report 5101-53 (1978) especially at pages 5-1 and 5-2 thereof, said document being incorporated herein by reference in its entirety.

The invention may be carried out with a deposition gas including HCl; e.g., HCl and silane.

We have discovered that providing a high rate of flow so as to produce turbulence in the flow path at the deposition area suppresses nucleation in the flow path other than at the heated deposition surface. Also, and just as important, the turbulent flow greatly increases the deposition rate on a heated substrate over the rates achieved in the prior art with laminar flow. A jet pump or ejector with high gas flow capability in a recycle or supply stream may be suitable for maintaining a turbulent flow in the reactor.

In addition to increased deposition rates and suppression of nucleation in the gas stream away from the deposition surface, our turbulent flow reactor and method may be so constructed as to provide relatively uniform growth rate over the length of the deposition surface along the flow path. While the mechanism of decomposition of silicon-containing compound at the deposition surface is not fully understood, the high velocity gas flow eliminates the mass transfer limit to growth, allowing growth at the kinetically limited surface reaction rate. The concentration of silicon-containing compound decreases very little along the flow path in the reactor, providing a nearly uniform growth rate.

For comparison, the time required to grow a one-inch thickness of silicon in a conventional Siemens reactor is about 100-200 hours whereas the reactor of the present invention may grow a one-inch slab in about one hour or less. Furthermore, turnaround time for the system of the invention including cooling, unloading (or melting), loading new supports and reheating to temperature may be accomplished in a few hours.

Where carrier gas is used, $H_2$ is a preferred carrier since $H_2$ is a decomposition by-product:

$$SiH_4 \rightarrow Si + 2H_2$$

thereby reducing gas recovery and separation problems.

An advantage of the present invention with turbulent flow gas stream and heated deposition surface is the energy savings realized from minimum heating of the $H_2$ carrier gas. Energy consumption is estimated to be less than one-half that of conventional deposition procedures.

Figure 1:
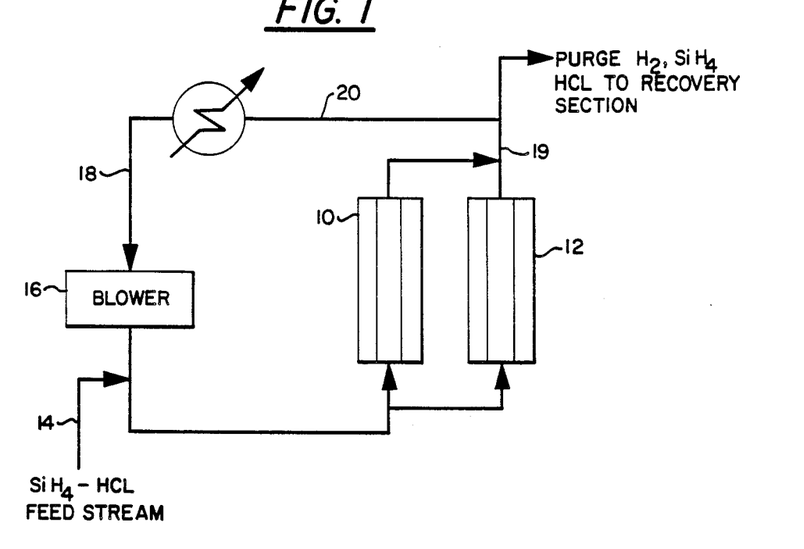
FIG. 1 is a schematic flow chart demonstrating gas flow in one embodiment of the invention with parallel reactors.

The system of the invention is represented in FIG. 1 where parallel reactors 10 and 12 are shown. The reactors 10 and 12 are operated sequentially to maintain the turbulent, recycle gas flow and maximize production by depositing in one reactor while the other reactor is either cooled and unloaded or heated for melt out to a mold (not shown). Of course three or more reactors could be used with optional operation of more than one at a time.

Referring now to FIG. 1, the deposition gas composition is fed into feed stream 14 ahead of recycle blower, ejector, or jet pump, 16. Hydrogen make-up supply 18 also receives recycled $H_2$ from line 20.

Figure 2:
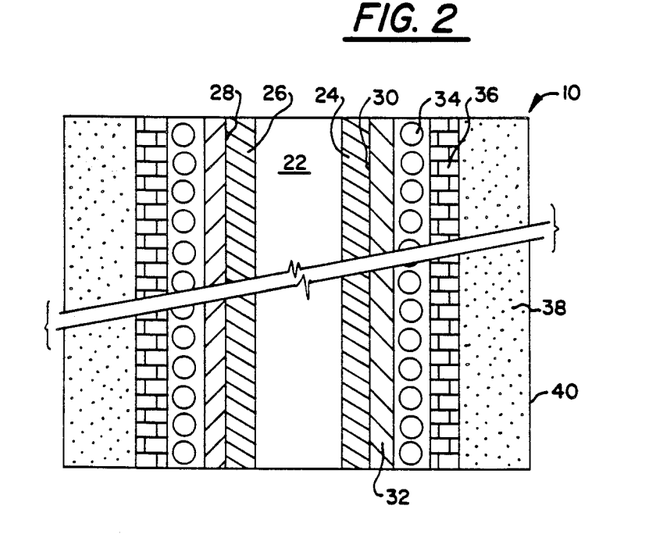
FIG. 2 is a fragmentary sectional view through the reactor of the invention.

The reactor 10 is shown in cross section in FIG. 2 with gas flow path 22 defined between the growing silicon bodies 24, 26 on liner surfaces 28, 30 of liner 32 which may be of integral construction of several assembled pieces. The flow path 22 may take various cross-sectional shapes including annular or rectangular since facing deposition surfaces provide a large energy savings due to conservation of radiant heat.

Molybdenum disilicide heating coils 34 are positioned adjacent the liner 32 which may be formed of or coated with molybdenum, graphite, silicon nitride or other suitable material. Refractory material 36 lines the heating coils 34. Insulation 38 is packed between the refractory material 36 and reactor housing 40.

Figure 3:
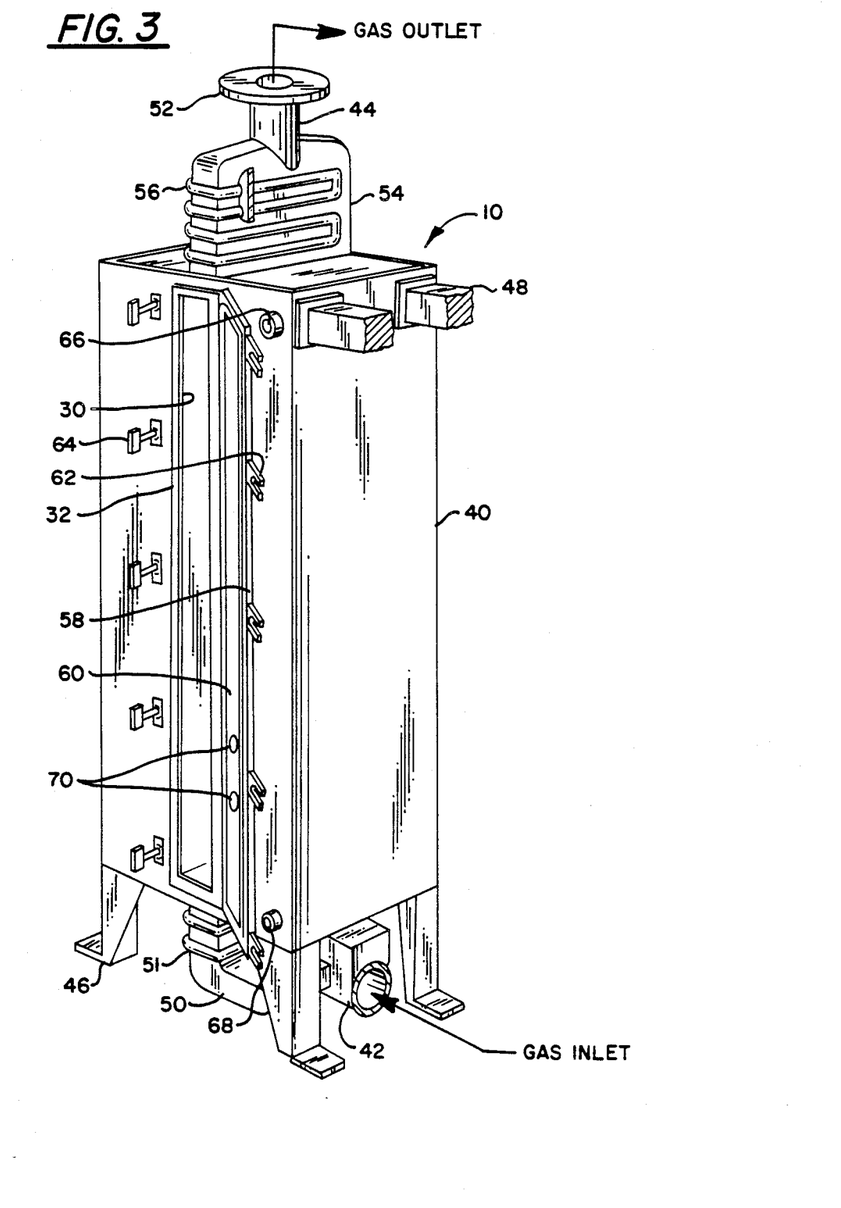
FIG. 3 is a perspective view partly in section of a reactor having cooling means for the gas inlet and outlet.

Referring now to FIG. 3, there shown is reactor 10 having gas inlet 42 and gas outlet 44. The inlet 42 and outlet 44 are designed to enhance turbulent gas flow past the deposition surface 30. That is, provided sufficiently fast gas flow and/or turbulence is provided at inlet 42, the reactor flow path is exposed to only turbulent flow by design.

The reactor is shown in the vertical position on legs 46, but may be optionally oriented more horizontally. Supports 48 provide additional rigidity and strength to the reactor 10 for turbulent flow therethrough.

The gas inlet 42 supplies gas at a high flow rate from blower 16 (FIG. 1) so as to produce within the reactor 10 a gas stream having a Reynold's Number ($N_{Re}$) in the turbulent region. For gas streams of the invention, this $N_{Re}$ is usually greater than about 2000-3000. Inlet 42 feeds into broadened portion 50 which has external coolant coils 51 to inhibit nucleation and inhibit deposit of silicon away from the reactor deposition surface 30. Gas outlet 44 is formed with flange 52 for sealing attachment to a gas recovery/recycle line 19 (FIG. 1). A wider portion 54 narrows at outlet 44. The wider portion 54 also has external coils 56 shown partially in section as being on the surface of wider portion 54.

The liner box 32 shown in FIG. 3 is removable from the opening the housing 40 so that silicon grown on the liner box may be removed by various methods. Alternative to this embodiment, the entire housing could be adaptable to a mold or other apparatus below the flow path in the place of the removed gas inlet. When means of catching a melt are in position, coils 34 (FIG. 2) may then be heated to above the melting point of the deposited metal but below that of the liner to melt out and retain the purified semiconductor material, e.g., silicon.

The opening in housing 40 may be sealed by closing the door 58 having polytetrafluoroethylene gasket 60 around the opening and over liner 32. Door 58 has latches 62 which cooperate with latch bolts 64 for sealing engagement. The reactor 10 may optionally be fluid cooled to capture excess radiant heat and for rapid cooling after deposition by providing flow conduits fed from coolant inlet 66 and recycled from coolant outlet 68. Quartz windows 70 are provided in door 58 to visually monitor silicon growth on the liner. Electronic or thermal means may also be suitable to monitor growth.

It may be advisable to chemically etch the deposited silicon about 0.01 inch or more to form a more uniform surface for subsequent processing. A gas stream of dilute HCl in an inert, e.g. $H_2$, could be used for this purpose.

The silicon slabs produced on surface 28 and 30 of the reactor may be cooled, removed, and handled by any suitable means. With the large volume reactors envisioned for production of high purity polycrystalline silicon, e.g., it will be necessary to provide heavy duty apparatus to lift and move the silicon slabs. The estimated weight of the grown silicon alone, two one-inch thick slabs one-foot by ten feet, when dense is about 150-200 lbs. A crane may be necessary.

According to the process of the invention and referring now to all of FIGS. 1, 2, and 3, $H_2$ gas is supplied at or about a flow rate of 35 pounds per hour to blower 16 which increases the flow rate and turbulence.

Figure 4:
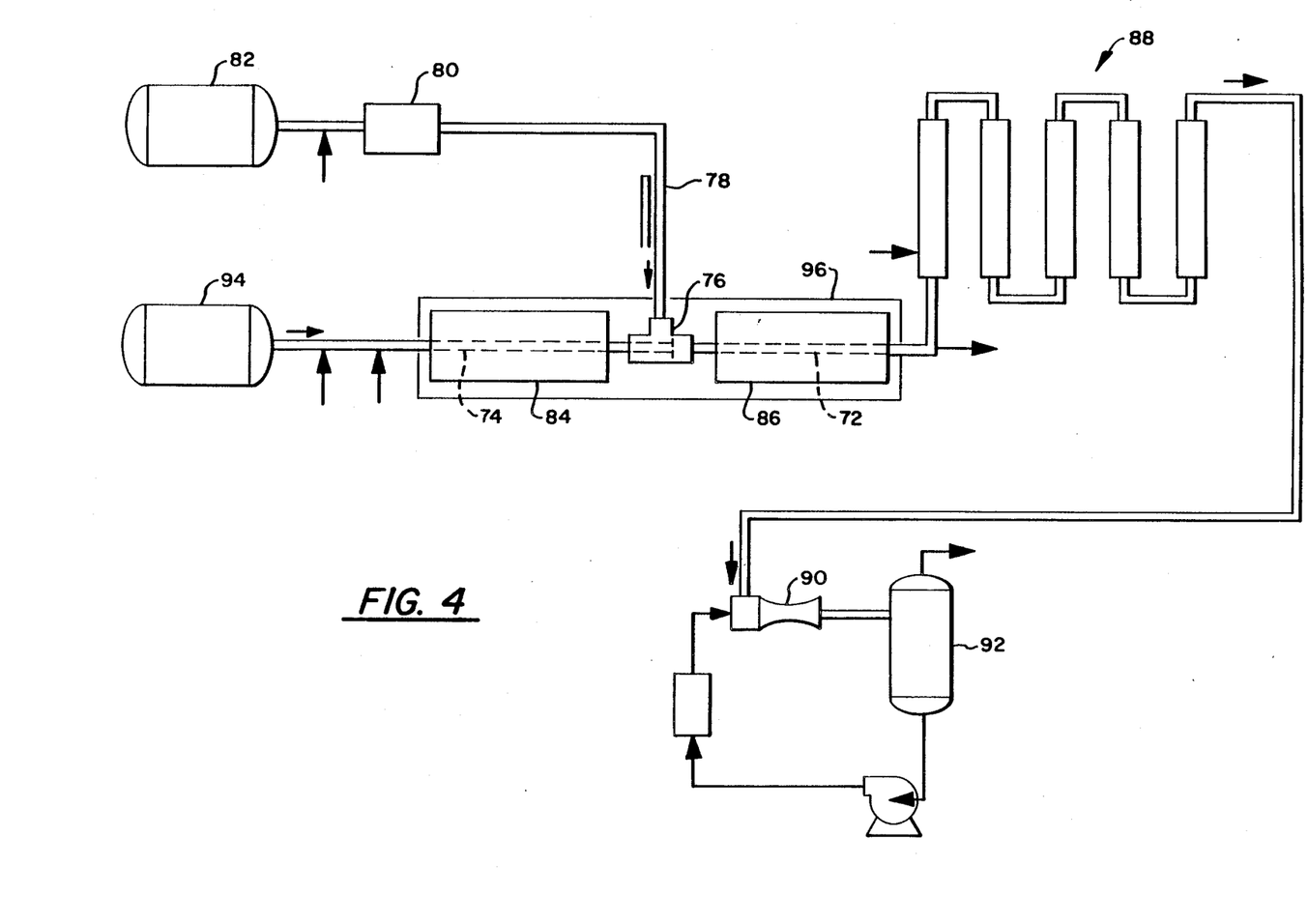
FIG. 4 is a schematic flow diagram of a CVD system.

A schematic of a test apparatus is shown in FIG. 4 wherein a CVD reactor 72 is in line with a $H_2$ preheat line 74. Trichlorosilane, silane, or other silicon-containing gas is fed to a mixing tee 76 from line 78. Where a liquid such as trichlorosilane is the feed gas, a vaporizer 80 is located in the feed line after a supply source 82 of feed gas.

Two tube furnaces 84 and 86 heat the hydrogen line 74 and deposition reactor 72 respectively. Coolers 88 precede a recovery system consisting of a venturi scrubber 90 and NaOH pot 92. In one proposed embodiment of the invention, the recovered hydrogen gas or resupply of hydrogen gas is passed through a fluid or stationary bed of noncontaminating material for heat exchange. This noncontaminating material may be silicon itself.

$H_2$ is supplied from a source 94 at about 10 lb./hour. The system was operated so as to provide substantially turbulent flow according to the invention; i.e., $N_{Re}>2000$, more preferably $N_{Re}>5000$. An inert, purged tunnel 96 surrounds the furnaces.

The system is maintained essentially oxygen free since $SiH_4$ is pyrophoric and ignites immediately upon contact with air. An $HCl-SiH_4$ combination has been found to be very stable. However, if the volume percent of a gas stream exceeds about 25% $HCl-SiH_4$, explosion may result. Also, it should be noted that $SiH_4$ is very volatile, highly acidic, and oxic. Therefore, the reactor should be flushed thoroughly with a harmless gas after silicon deposition is halted. The present invention is advantageous in limiting or eliminating "dusting" (silicon dust created in the gas flow) but care should be taken that no particulate silicon is formed or vented during any phase of the process since dust or particles may represent an inhalation hazard.

As the gas flow proceeds to the selected reactor, 10 or 12, of FIG. 1, the turbulent nature of the flow is maintained or enhanced by the gas inlet structure. Also the main gas flow is maintained at a temperature below decomposition temperature for the silicon-containing compound in all areas since radiation heating of the gas stream from the liner to the gas flow in the broadened portion 50 and wider portion 54 are offset by the external coils 51 and 56. In this manner the gas stream stays at or below a temperature where any significant decomposition occurs, thereby avoiding dusting. Of course decomposition occurs in the areas of turbulence in contact with the deposition surface 28 and 30 of liner 32. The surface 28 and 30 are heated by coils 34 to a higher temperature for decomposition of the silicon-containing compound at or near surface 28 and 30. As deposition of silicon on the heated substrate begins to occur and build, it may be necessary to increase the heat of the coils 34 somewhat so as to maintain on the growing silicon surface, a temperature sufficient for rapid deposition.

It has been found that for the tubular reactor of FIG. 4 and the following examples, a specially designed insert for tee 76 promotes mixing of the silicon-containing compound and carrier gas. The insert is applicable to other embodiments and is designed so that the jets of silicon-containing gas impinges on the carrier gas at about 20 ft./sec. An insert with about 16 evenly spaced holes drilled therethrough was used in the runs of Example 1.

The reactor and liner may be constructed so that the liner is surrounded by RF coils, radiant lamps, resistive heating means, or even a waste heat stream such as a flue gas, thereby allowing heating of the deposition surfaces or optionally, meltout of the deposited silicon.

The following non-limiting examples of the invention further explain the operation of the process and apparatus of the invention.

EXAMPLE I

A single pass turbulent flow silicon deposition reactor was constructed using a one inch diameter Inconel 617 pipe six feet in length. A tunnel of aluminum sections was placed over the entire hydrogen-containing, furnace-heated system. The aluminum tunnel was continuously purged with nitrogen to minimize possible fire hazards from hydrogen leaks or breaks in the reactor.

The trichlorosilane was fed from 100 pound cylinders which were weighed to verify the amount of reactant used. The hydrogen was fed from a 45,000 $ft^3$ trailer and its feed was maintained and adjusted by pneumatic control.

For safety considerations, solenoid control valves were installed in the hydrogen and reactant feed lines so they could be activated to be closed by a single button at the doorway to the room where the reaction was carried out.

In order to eliminate pre-reaction during heating, the hydrogen carrier gas was preheated and then mixed with the relatively cool trichlorosilane (or silane) in a specially designed tee just prior to entry into the heated reactor tube. The hydrogen was introduced through the run of the tee and flowed inside an insert which had been drilled radially with 16 holes. The insert was lathed down on the outside to allow the reactant gas entering through the branch of the tee to flow around the annular space and tangentially to the hydrogen. Thus, the trichlorosilane or silane cooled the tee preventing decomposition which might result in plugging of the tee. The mixture of gases continued into a heated reactor section where chemical vapor deposition occurred.

The gases were supplied through 316 stainless steel tubing. The reactor tube was constructed so as to be removable to evaluate results. The reactor tube was cut out after each run and replaced with a fresh tube section, product samples being withdrawn for analysis from the deposits on the inside tube walls. The tube was cut into ten sections after each run so that each section could be separately weighed and observed.

The entire system was equipped with pneumatic control loops to regulate the flows of hydrogen and trichlorosilane (or silane) and the pressure on the system. A thermocouple was installed to measure reactant inlet temperature at the mixing tee. Additional thermocouples were attached at about six inch intervals along the outside reactor section with a total of six thermocouples in each of the two furnaces which heated the reactor. High temperature, two-inch Lindberg furnaces were used for heating. Three were used to preheat the hydrogen and two were used in succession to heat the reactor section, each having its own standard temperature control module. The gas feed tee was located between the hydrogen preheat section and the reactor furnaces. The pressure drop across the reactor was recorded.

A schematic representation of the feed, reactor, and recovery system is shown in FIG. 4. After each successive run, the reactor tube was cut out with a 3-bladed tubing cutter and a new section was heliarc welded back in place for the next run. Ten experiments were carried out using trichlorosilane (8 mole%) and hydrogen mixtures to study the chemical vapor deposition of polysilicon on the inside wall of the one inch pipe. Data was obtained for the ten runs using various temperatures and pressures with Reynold's Numbers in the turbulent flow range up to about 10,000. The deposition rates for trichlorosilane deposition are shown in the following Table 1.

TABLE I

| Run No. | $N_{Re}$ | $H_2$ Preheat Temp. °C. | TCS Feed Temp. °C. | Outside Wall Temp.[1] °C. | Reaction Time Minutes | Deposition Rate[2] $\mu$/min. | $g/min/cm^2$ |
|---|---|---|---|---|---|---|---|
| 1 | 9360 | 535 | 190 | 910 | 240 | 1.8 | $4.5 \times 10^{-4}$ |
| 2 | 9690 | 535 | 190 | 910 | 240 | 0.68 | $1.6 \times 10^{-4}$ |
| 3 | 9240 | 525 | 190 | 972 | 150 | 1.2 | $1.2 \times 10^{-4}$ |
| 4 | 9400 | 525 | 180 | 890 | 180 | 2.6 | Aborted |
| 5[3] | 9700 | 525 | 188 | 968 | 210 | 2.6 | $6.1 \times 10^{-4}$ |
| 6 | 8700 | 700 | 270 | 1084 | 91 | 13.6 | $32 \times 10^{-4}$ |
| 7 | 8490 | 690 | 285 | 1016 | 110 | 7.5 | $18 \times 10^{-4}$ |
| 8 | 8500 | 700 | 270 | 1048 | 110 | 7.2 | $17 \times 10^{-4}$ |
| 9 | 8620 | 690 | 245 | 925 | 137 | 1.0 | $1.0 \times 10^{-4}$ |
| 10 | 8600 | 700 | 260 | 913 | 125 | 1.0 | $2.3 \times 10^{-4}$ |

[1]Measured at the 8th section of reactor tube; inside wall temperature is estimated to be cooler.
[2]Based on total mass deposited on effective inside deposition surface of 1531 $cm^2$.
[3]Reactor tube not sectioned.

The literature reports values of aobut 37±K cal/g mol for the activation energy of trichlorosilane deposition. This study indicated a value of about 36 kilocalories per gram mole, in agreement therewith. The ten runs using trichlorosilane indicated that the variation in pressure from 20 to 45 pounds per square inch gauge showed little effect on the deposition rate or activation energy.

The deposits obtained in the various sections of the reactor from the trichlorosilane runs were examined by using electron microscopy and x-ray defraction. These tests showed only silicon on the growing surface with growth by incorporation of oval balls and occasional voids. If the thickness of the silicon deposit was less than about 50 mils, the material grew in extended sheets which shattered off the pipe wall on cooling due to the large difference in thermal expansion. As the temperature used for deposition was increased and the deposit was made thicker, the growing surface became more irregular. Density measurements in octane were about 2.3 as compared to pure silicon of about 2.32. However, the apparent density measured in mercury was only 1.03 grams per cc due to pores and voids. The porosity measurement was 55.6%. No bulk gas phase decomposition was noticed for trichlorosilane.

In Run No. 1 two molybdenum-sheathed thermocouples were inserted through the exit ell to measure inside wall temperature and bulk gas temperature. The longer thermocouple, inside the furnace against the pipe wall, showed readings that nearly corresponded with the nominal furnace settings until the trichlorosilane feed was started. Thereafter, the reading dropped about 50° through the first hour of operation until the thermocouple failed. The bulk gas thermocouple gave readings of about 707±5° C. during the entire run.

After each run the apparatus was allowed to cool overnight before the reactor pipe was cut out, examined and replaced. When the reactor from Run No. 1 was cut for removal, the long wall temperature thermocouple was stuck to a massive silicon deposit and broke off. Although the shorter bulk gas thermocouple remained intact, it had deposits of silicon along its molybdenum sheath, which deposits prevented removal of the thermocouple from its fitting. Therefore, neither of these thermocouples was used for subsequent runs.

Trichlorosilane was fed as a liquid through a rotameter and then to a pneumatically controlled valve before entering a steam-heated exchanger for vaporization. The vapor was further heated by cal-rod heaters along the trichlorosilane feed line. The temperature of the heated vapor was measured with a thermocouple in a well inside the tube at the ell above the mixing tee.

For Runs 3-10, K-type thermocouples covered with Nextel sheathing were mounted on the outside wall of the reactor pipe, spaced six inches apart along the reactor. Nextel is a registered trademark of Minnesota Mining and Manufacturing Corporation. The tip of each thermocouple was fastened tight to the Inconel pipe with tantalum wire to give good contact and reasonably accurate wall temperatures along the reactor section. A multipoint switching device was connected to a read out instrument so that the temperatures could be monitored.

Measurements of the temperatures were taken at intervals of about 10-20 minutes during each run. After each run the tantalum wires were embrittled allowing easy breakage for removal of the twelve thermocouples. Also, the silicon carbide heating elements were removed after each run to minimize breakage during replacement of the reactor pipe. Run No. 4 was aborted because deposition was minimal and the temperature of the reactor was not well controlled.

Between Runs 5 and 6, tests were conducted to determine the variance between the inside and outside wall temperatures of the reactor by using a helium feed at about 700° C. The internal wall temperatures were determined to be about 60° lower than the outside temperature measured by the thermocouples.

In the highest temperature run made (No. 6) there was a sizable layer of silicon-Inconel eutectic between the polysilicon and the remaining wall. The combination of eutectic and remaining Inconel wall was measured to be about the same thickness as the original pipe.

Polysilicon deposits were removed from all cut pipe sections and weighed. The total weight for each run was used to calculate the deposition rates in the table above. It should be noted that not entirely all of the produced silicon was reported since a small portion of the silicon was loose and moved out of the reactor pipe. Analyses was made of product gases for Run No. 7. The analyses showed 9.7% HCl, 6.9% $SiH_2Cl_2$, 74.75% $SiHCl_3$, and 8.67% $SiCl_4$, on the average.

The scanning electron microscope photomicrographs showed growth from trichlorosilane as rounded, knobby-topped columns with fairly porous interstices between the columns. In some cases the growth became more fibrous with depth.

A review of the above experiments indicates that silicon's chemical vapor deposition is significantly enhanced by operating at fully turbulent flow conditions. The deposition growth rates in the literature are reported for laminar flow. While some good rates are reported, the rate could be enhanced under most circumstances with various deposition gases where appropriate equipment is provided to provide turbulent flow. The above experiments indicate growth rates of about 20 microns per minute at 1,000° C. and 4 microns per minute at 900° C. This vastly improved deposition rate is totally unexpected and nowhere reported or suggested in the literature for such relatively low temperatures.

It should be pointed out that temperature control of the apparatus used in Examples I and II was not optimized. The construction of the apparatus for these experiments permitted "cold spots" between heaters along the length of the reactor tube which did not deposit silicon as efficiently as possible. Thus, the deposition rates reported in Tables I and II are somewhat lower than may be achieved in a reactor heated consistently along its length.

For example the measured outside wall temperature profile along the reactor for Run No. 7 was (six-inch spacing) 605°, 944°, 959°, 1028°, 1084°, 784°, 736°, 1040°, 1016°, 1004°, 1070°, and 793° C. Similar profiles were measured for the other runs.

EXAMPLE II

Similar results to those obtained in the reactions of Example I were obtained using a silane feed. Three runs were made using the silane feed and the data are reported in Table II below.

Note that at the nominal temperature of 950° C. Run 11 with a flow rate of 8.4 pounds per hour silane and 7 pounds per hour hydrogen (7 mole % silane) was terminated after about 10 minutes due to rapid pressure rise caused by extensive deposition of silicon and plugging of the pipe. Deposits from silane at 750° C. were much more homogenous and showed a smoother surface with no internal holes as compared to the trichlorosilane deposits. A high apparent density of 2.2 grams per cc was measured in mercury with porosity of only 4.7%. Analysis of the silane-deposited silicon at 950° C. showed about ½ the density of pure silicon. The lower temperature Runs 12 and 13 were carried out so as to intentionally deposit silicon at a slower rate and thereby facilitate study of the process controls and apparatus.

There was a small amount of bulk gas phase decomposition noticed for the silane runs at high temperature but only very small amounts at the lower temperature of 750° C. This decomposition was about 5% of the polysilicon deposit for the silane runs and was analyzed by x-ray defraction to be only silicon. The silane was supplied from regular 1-A cylinders. Since the first silane run plugged at 950° C. and 25 psia reactor pressure the run lasted only about 10 minutes. There was a sizable volume of material lying in the exit tubes and in the caustic scrubber. This material was light brown and very fluffy, weighing about only 10 grams of the total 300+ grams deposited.

As noted above, the final two silane runs were made at 200° C. lower temperature to give a reasonable chance for a long duration run that could be evaluated. The flow rates for Run 12 were 9.5 pound per hour silane and 7 pounds per hour hydrogen (8 mole % silane). Growth rates were determined from thickness measurements of the deposit to be about 0.42 to 0.67 microns per minute.

Run 13 was made with the same reactor furnace settings as in Run 12 but the silane feed rate was increased to 12.2 pounds per hour. The hydrogen flow rate remained at 7 pounds per hour (10 mole % silane). With an inside wall temperature of approximately 700° C. the growth rate of deposit was estimated to be about 2.5 microns per minute on the reaction surfaces at this temperature.

In a commercial process, one would envision very probably operating at still higher temperatures then those presented in Tables I and II above so as to take maximum benefit when operating in the turbulent region of the high rate of silicon species mass transfer from the silicon-containing gas stream to the heated deposition surface.

The experimental results demonstrate that the turbulent flow process of the present invention may be used in appropriate size apparatus to deposit pure silicon at a rate more than ten times faster than that estimated by extrapolation of prior art process data on laminar flow processes.

It is possible to vary certain aspects of the invention such as metal-containing compound, carrier gas, reactor orientation and structure or other features without departing from the scope or spirit of the invention as defined by the appended claims.

We claim:

1. A reactor for growing high purity silicon from a deposition gas containing silicon, said reactor comprising:
   (a) an insulated housing;
   (b) a liner box having a deposition surface within said box defining a gas flow path, said liner box being adapted to fit inside said housing and to be removable therefrom, said deposition surface being noncontaminating to silicon;
   (c) means for supplying a turbulent flow of deposition gas to the flow path to deposit silicon on said deposition surface;
   (d) means for exhausting gas from the flow path; and
   (e) means for controlling the temperature of said deposition surface and silicon deposited thereon so

TABLE II

| Run No. | $N_{Re}$ | H$_2$ Preheat Temp. °C. | Silane Feed Mole % | °C. | Outside Wall Temp.[1] °C. | Reaction Time Minutes | Deposition Rate[2] μ/min. | g/min/cm$^2$ |
|---|---|---|---|---|---|---|---|---|
| 1 | 5100 | 360 | 7 | 49 | 925 | 10 | 89 | 209 × 10$^{-4}$ |
| 2 | 5350 | 360 | 8 | 86 | 720 | 120 | 0.5 | 1.4 × 10$^{-4}$ |
| 3 | 6060 | 360 | 10 | 116 | 696 | 78 | 0.4 | 1 × 10$^{-4}$ |

[1] Measured at the 8th section of reactor tube; inside wall temperature is estimated to be cooler.
[2] Based on total mass deposited on effective inside deposition surface of 1531 cm$^2$.

as to decompose turbulent flow deposition gas in contact therewith and deposit silicon from the gas.

2. The reactor of claim 1 wherein said liner is removable for collection of deposited silicon.

3. The reactor of claim 1 wherein said liner is constructed of a material having a melting point equal to or above the melting point of silicon.

4. The reactor of claim 3 wherein said liner is constructed of silicon.

5. The reactor of claim 1 wherein the deposition surface comprises molybdenum, graphite, silicon nitride, silicon carbide, silicon, quartz, or a silicon-aluminum-oxygen compound.

6. The reactor of claim 1 further comprising means for melting the deposited silicon from said liner and means for collecting the melted silicon.

7. The reactor of claim 5 wherein said liner has a silicon nitride or silicon coating to facilitate melting and removal of deposited silicon.

8. The reactor of claim 1 wherein said temperature controlling means is RF heating coils disposed about said liner.

9. The reactor of claim 1 wherein said temperature controlling means is resistive heating means adjacent said liner.

10. The reactor of claim 1 wherein the deposition surface of said liner has at least two deposition areas facing across the flow path.

11. The reactor of claim 10 wherein said liner is rectangular in cross section.

* * * * *